United States Patent
Wegleiter et al.

(10) Patent No.: US 8,513,682 B2
(45) Date of Patent: Aug. 20, 2013

(54) OPTOELECTRONIC COMPONENT AND PRODUCTION METHOD FOR AN OPTOELECTRONIC COMPONENT

(75) Inventors: Walter Wegleiter, Nittendorf (DE); Norbert Stath, Regensburg (DE); Bert Braune, Wenzenbach (DE); Karl Weidner, Munich (DE); Matthias Rebhan, Riemerling (DE); Hans Wulkesch, Munich (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 69 days.

(21) Appl. No.: 12/808,953

(22) PCT Filed: Dec. 11, 2008

(86) PCT No.: PCT/DE2008/002067
§ 371 (c)(1),
(2), (4) Date: Jul. 20, 2010

(87) PCT Pub. No.: WO2009/079985
PCT Pub. Date: Jul. 2, 2009

(65) Prior Publication Data
US 2010/0301355 A1    Dec. 2, 2010

(30) Foreign Application Priority Data

Dec. 21, 2007 (DE) .......................... 10 2007 062 045
Apr. 21, 2008 (DE) .......................... 10 2008 019 902

(51) Int. Cl.
*H01L 33/00* (2010.01)

(52) U.S. Cl.
USPC .......................... 257/91; 257/E33.07; 438/28

(58) Field of Classification Search
USPC ......... 257/91, E33.067, E33.07, 88, E33.068, 257/99; 438/28, 29
See application file for complete search history.

(56) References Cited

U.S. PATENT DOCUMENTS 6,111,272 A    8/2000  Heinen
6,410,942 B1   6/2002  Thibeault et al.
(Continued)

FOREIGN PATENT DOCUMENTS

CN      1456025 A       11/2003
DE      103 39 985 A1   3/2005
(Continued)

OTHER PUBLICATIONS

Schnitzer, I., et al., "30% External Quantum Efficiency from Surface Textured, Thin-Film Light-Emitting Diodes," Applied Physics Letters, Oct. 18, 1993, 3 pages, American Institute of Physics.

*Primary Examiner* — Julio J Maldonado
*Assistant Examiner* — Daniel Shook
(74) *Attorney, Agent, or Firm* — Slater & Matsil, L.L.P.

(57) ABSTRACT

An optoelectronic component includes a carrier element. At least two elements are arranged in an adjacent fashion on a first side of the carrier element. Each element has at least one optically active region for generating the electromagnetic radiation. The optoelectronic component has an electrically insulating protective layer arranged at least in part on a surface of the at least two adjacent elements which lies opposite the first side. The protective layer, at least in a first region arranged between the at least two adjacent elements, at least predominantly prevents a transmission of the electromagnetic radiation generated by the optically active regions.

20 Claims, 6 Drawing Sheets

(56) References Cited

U.S. PATENT DOCUMENTS

| | | |
|---|---|---|
| 7,109,527 B2 | 9/2006 | Illek et al. |
| 2002/0017652 A1 | 2/2002 | Illek et al. |
| 2003/0132447 A1 | 7/2003 | Yukimoto |
| 2004/0084682 A1 | 5/2004 | Illek et al. |
| 2006/0055309 A1 * | 3/2006 | Ono et al. ............ 313/492 |
| 2006/0082297 A1 | 4/2006 | Camp |
| 2006/0145164 A1 | 7/2006 | Illek et al. |
| 2006/0180820 A1 | 8/2006 | Illek et al. |
| 2006/0214579 A1 * | 9/2006 | Iwase et al. ............ 313/512 |
| 2009/0127573 A1 | 5/2009 | Guenther et al. |
| 2010/0117103 A1 | 5/2010 | Marfeld et al. |

FOREIGN PATENT DOCUMENTS

| | | |
|---|---|---|
| DE | 10339985 A1 * | 3/2005 |
| DE | 10 2004 050 371 A1 | 4/2006 |
| DE | 10 2006 015 115 A1 | 10/2007 |
| DE | 10 2007 011 123 A1 | 9/2008 |
| EP | EP 0 905 797 A2 | 3/1999 |
| JP | 55-077876 U | 5/1980 |
| JP | 60-253286 A | 12/1985 |
| JP | 60253286 A * | 12/1985 |
| JP | 62-199073 A | 9/1987 |
| JP | 64-071187 A | 3/1989 |
| JP | 64071187 A * | 3/1989 |
| JP | 11-238915 A | 8/1999 |
| JP | 2006-086191 A | 3/2006 |
| TW | 200301972 A | 7/2003 |
| WO | WO 2007/025521 A2 | 5/1980 |
| WO | WO 97/48138 | 12/1997 |
| WO | WO 02/13281 A1 | 2/2002 |
| WO | WO 03/012884 A1 | 2/2003 |
| WO | WO 2006/044894 A2 | 4/2006 |

* cited by examiner

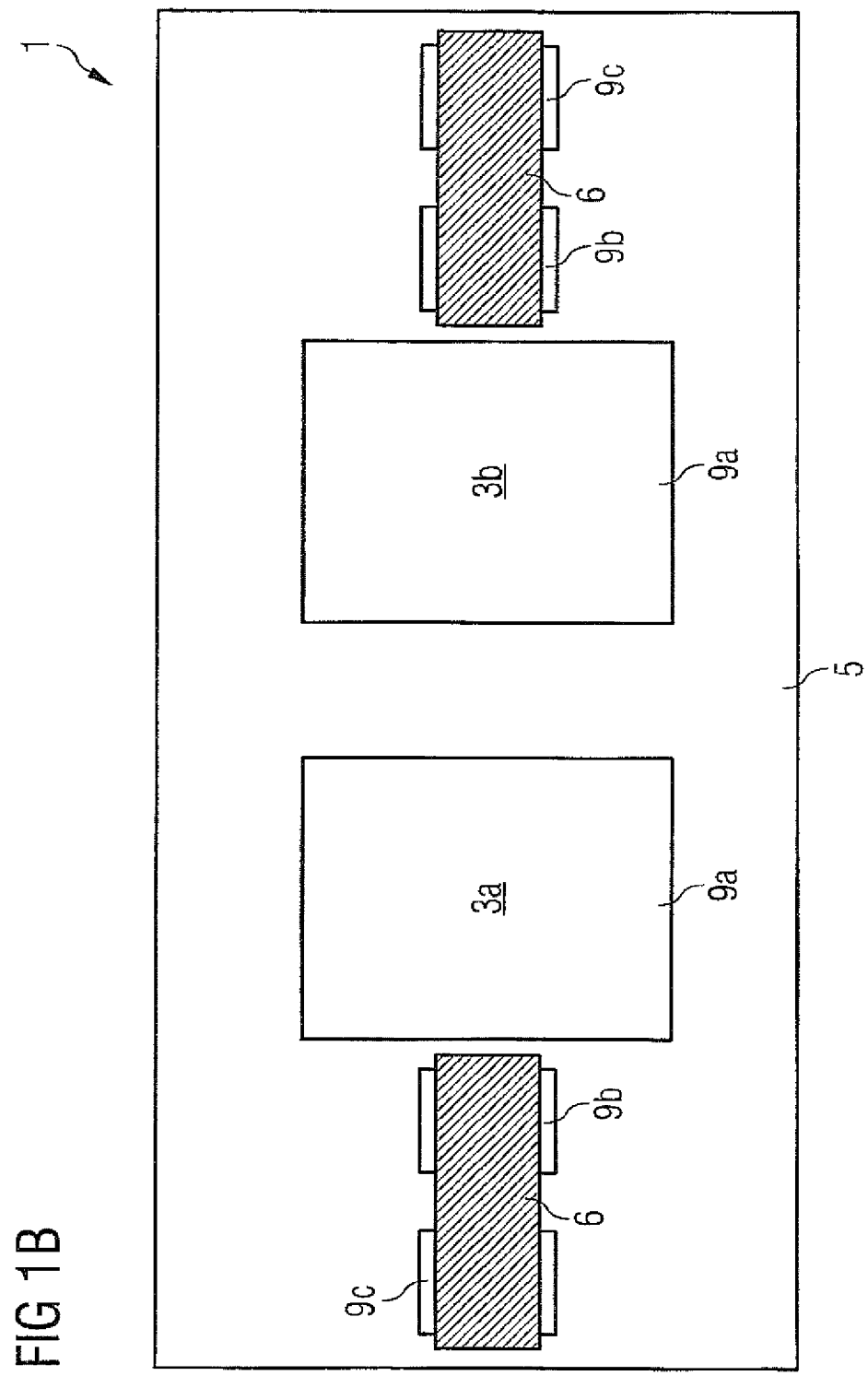

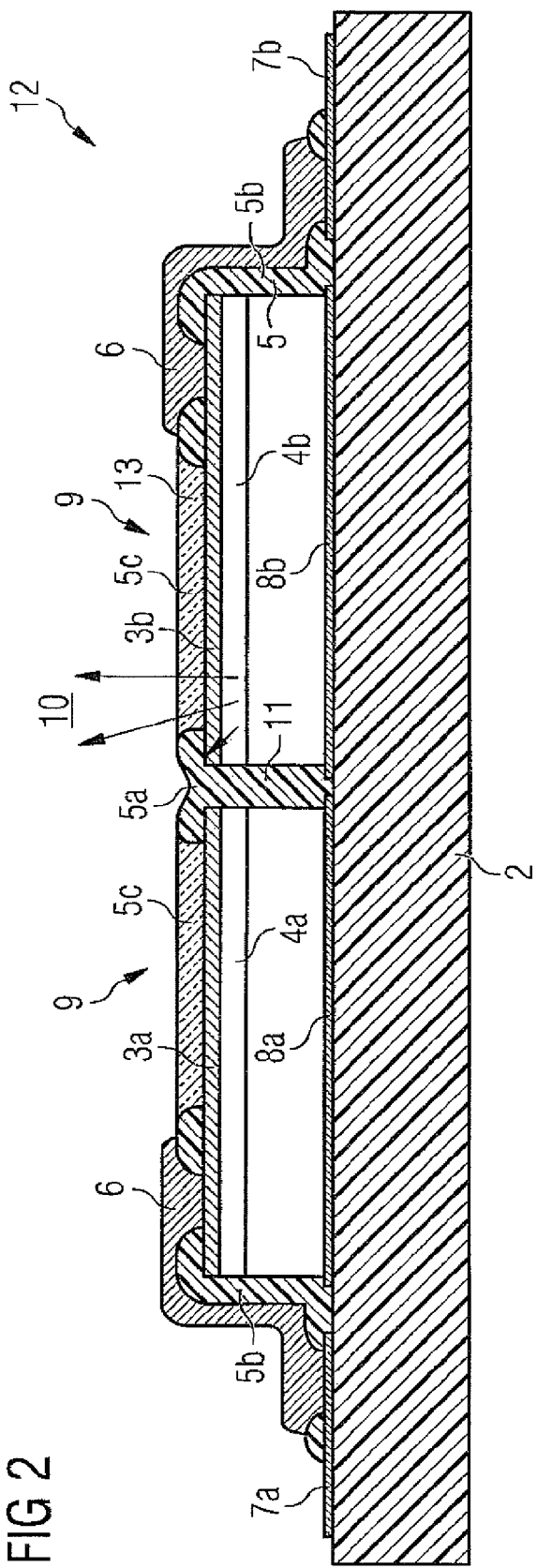

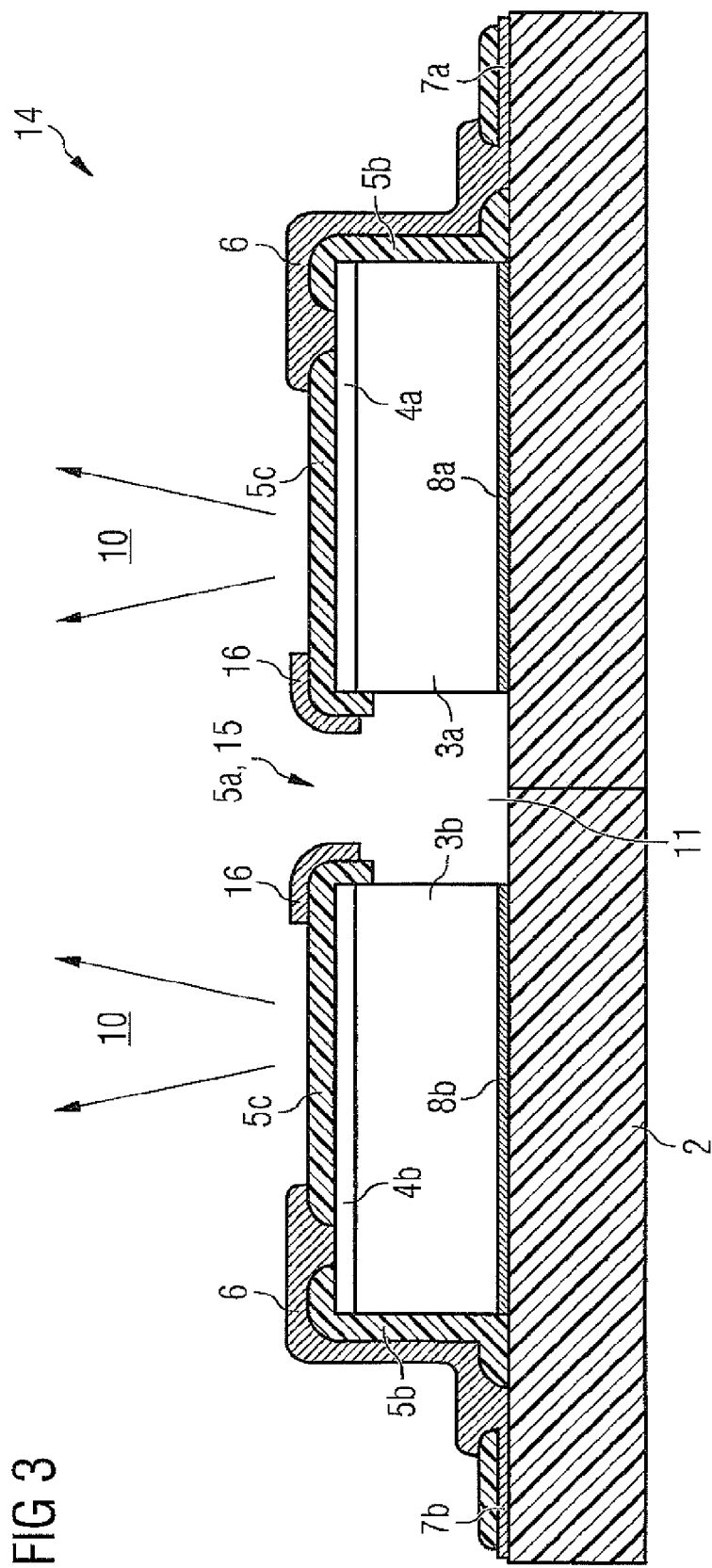

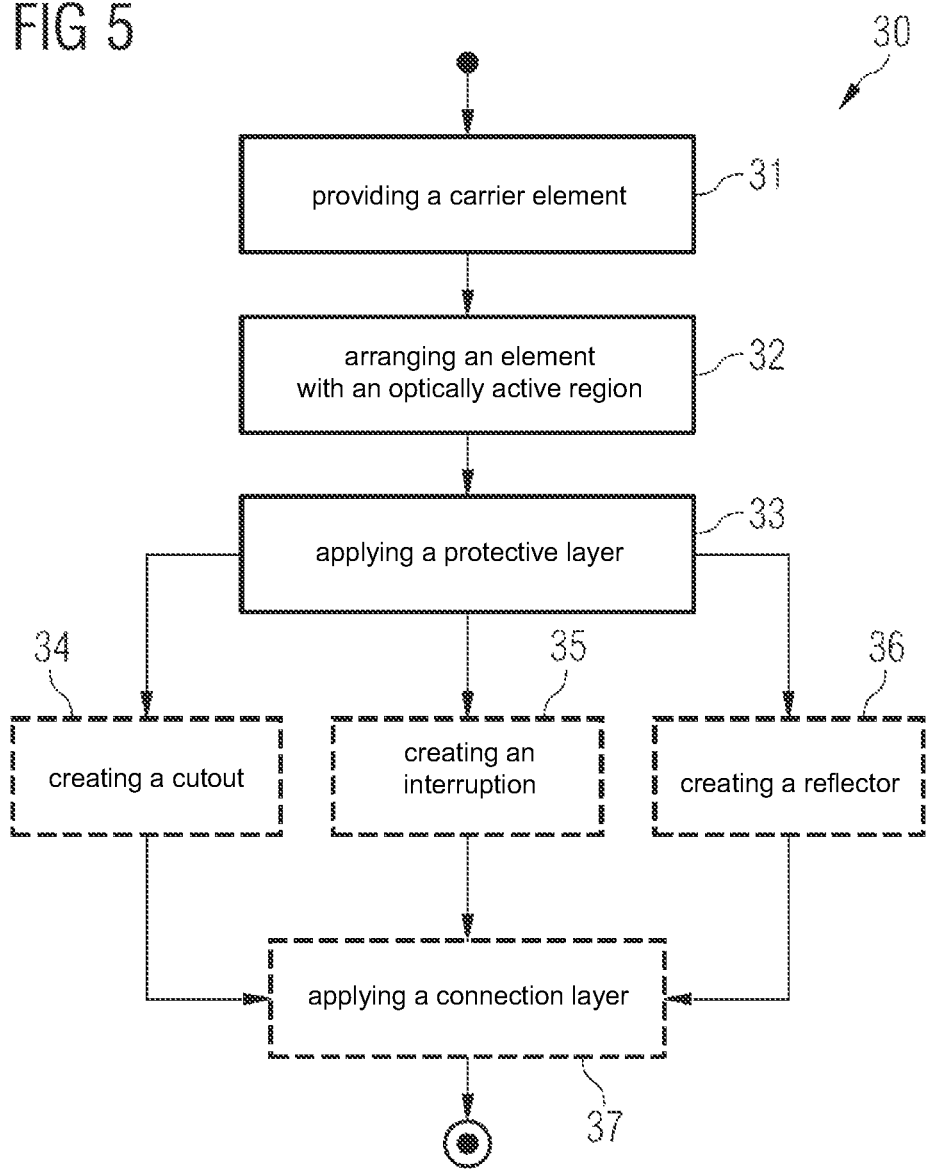

OPTOELECTRONIC COMPONENT AND PRODUCTION METHOD FOR AN OPTOELECTRONIC COMPONENT

This patent application is a national phase filing under section 371 of PCT/DE2008/002067, filed Dec. 11, 2008, which claims the priority of German patent applications 10 2007 062 045.6, filed Dec. 21, 2007 and 10 2008 019 902.8, filed Apr. 21, 2008, each of which is incorporated herein by reference in its entirety.

TECHNICAL FIELD

The invention relates to an optoelectronic component comprising a carrier element and at least two elements arranged adjacent to one another on a first side of the carrier element and each having at least one optically active region for generating electromagnetic radiation.

BACKGROUND

Optoelectronic components comprising two or more elements arranged in an adjacent fashion for generating electromagnetic radiation are known. In the lighting field, in particular, where comparatively high energy densities of emitted electromagnetic radiation are intended to be achieved, a multiplicity of luminous elements arranged on a common carrier element is often used.

In some areas of application, for example in the case of active matrix displays or else in motor vehicle lighting technology, the spurious luminescence of adjacent elements (also called crosstalk) and/or optical waveguide effects are intended to be minimized. Spurious luminescence of adjacent elements leads to a reduction of contrast, which may be disadvantageous for these applications. By way of example, for lighting units of a motor vehicle headlight, a sharp demarcation of those elements which are assigned to a low-beam light and those elements which are assigned to a high-beam light operating mode is required.

SUMMARY

In one aspect the present invention provides an optoelectronic component of the type mentioned above in which spurious luminescence of adjacent elements, each having at least one optically active region for generating electromagnetic radiation, is prevented or at least greatly reduced. Further aspects specify a production method which allows such an optoelectronic component to be produced in a simple manner.

An optoelectronic component according to the invention has an electrically insulating protective layer arranged at least in part on a surface of the at least two adjacent elements which lies opposite the first side, wherein the protective layer, at least in a first region arranged between the at least two adjacent elements at least predominantly prevents a transmission of the electromagnetic radiation which can be generated by the optically active regions.

By using an electrically insulating protective layer which at least predominantly prevents a transmission of the electromagnetic radiation which can be generated, it is possible for spurious luminescence of adjacent elements to be substantially reduced or even avoided.

In accordance with one advantageous configuration, the electrically insulating protective layer is interrupted in the first region. In accordance with a further advantageous configuration, the electrically insulating protective layer absorbs the electromagnetic radiation in the first region, such that said protective layer is opaque to the electromagnetic radiation in the first region. If the protective layer is interrupted in the first region or if it absorbs the electromagnetic radiation, no or only a significantly reduced transmission from the first to the second optically active region takes place by means of wave guiding in the protective layer.

In accordance with one advantageous configuration, a depression is arranged between the at least two adjacent elements. In accordance with a further advantageous configuration, the depression extends over the entire height of the at least two elements. The depression between the first and second optically active elements reduces an optical coupling of the two elements arranged in an adjacent fashion, particularly if it extends over the entire height.

In accordance with a further advantageous configuration, a reflecting element is arranged in the first region, said reflecting element extending at least partly into the depression. In accordance with a further configuration, the reflecting element completely fills the depression in a direction towards the carrier element. The reflecting element reflects the radiation generated by the respective optically active region, such that an excitation of the respective other optically active region is avoided, particularly if the reflecting element completely fills the depression.

In accordance with a further configuration, the reflecting element comprises a galvanically applied metal layer. In accordance with a further configuration, the galvanically applied metal layer is embodied as a connection element, for example as a copper pillar, for electrically connecting at least one of the optically active regions. This has the advantage that the reflecting element can be produced in a simple manner together with other production steps, for instance that of applying a connection contact.

In accordance with a further advantageous configuration, the protective layer penetrates at least partly into the depression in a direction towards the carrier element. A diaphragm effect of the protective layer is achieved by virtue of the protective layer penetrating into the depression.

In accordance with a further advantageous configuration, the protective layer completely fills the depression in a direction towards the carrier element. This brings about an improved optical separation of the adjacent elements.

In accordance with a further advantageous configuration, an electrically conductive connection layer for feeding an electrical voltage to the at least two optically active regions is arranged on at least one second region of the protective layer. The electrical connection of the at least two optically active regions can be simplified by virtue of an electrically conductive connection layer being arranged on the protective layer.

In accordance with a further advantageous configuration, the protective layer, in the second region, is at least predominantly opaque to the electromagnetic radiation generated by the optically active regions. Such a configuration makes it possible to reduce undesired reflections from the connection layer back to the optically active regions.

In accordance with a further advantageous configuration, at least one electrically conductive contact area for electrically connecting at least one of the optically active regions is arranged on the carrier element. The use of an electrically conductive contact area enables the electrical contact-connection of the optically active regions to be simplified further.

In accordance with a further advantageous configuration, a photoluminescent conversion layer is arranged in at least one third region of the protective layer, said conversion layer absorbing electromagnetic radiation having a first wavelength and emitting electromagnetic radiation having a second wavelength. Through the use of a photoluminescent conversion layer in a third region of the protective layer, the radiation profile of the at least two adjacent elements is adapted in accordance with requirements.

In accordance with a further advantageous configuration, the at least two adjacent elements are in each case embodied as a luminescence diode structure, in particular as an LED or OLED structure. The use of LED or OLED structures permits simple and efficient generation of electromagnetic radiation by the at least two adjacent elements.

In accordance with a further advantageous configuration, the luminescence diodes are embodied as thin-film light emitting diode chips. By using substrateless semiconductor layer stacks, it is possible to manufacture particularly thin optoelectronic components.

In accordance with a further advantageous configuration, the at least two adjacent elements are in each case embodied as a surface emitter. The use of a surface emitter allows particularly advantageous beam formation.

In accordance with a further advantageous configuration, a plurality of elements each having at least one optically active region are arranged on the first side of the carrier element, wherein the plurality of elements forms a matrix structure. Through the use of a plurality of elements in a matrix structure, diverse luminous patterns and display functions can be produced by the component.

In accordance with a further advantageous configuration, at least parts of the protective layer are embodied as a colored, in particular black, foil. The use of colored foils allows the protective layer to be produced and applied in a particularly simple manner.

In accordance with a further advantageous configuration, the colored foil comprises a polymer, in particular a silicone. Polymer foils can be produced in a large number of colors with desired properties. Silicone material has a high durability under the action of short-wave electromagnetic radiation and is therefore suitable particularly in the case of use with optically active regions which emit electromagnetic radiation in the blue or ultraviolet range.

In accordance with a further advantageous configuration, the foil has at least one cutout in each case in the region of the at least two optically active regions. By virtue of the cutout in the region of the at least two optically active regions, the foil acts as a diaphragm element that can be produced in a simple manner for an underlying radiation area.

A production method for an optoelectronic component according to the invention is disclosed. At least two elements, each having at least one optically active region for generating an electromagnetic radiation, are arranged in adjacent fashion on a first side of a carrier element. An electrically insulating protective layer is applied to a surface of the at least two adjacent elements which lies opposite the first side. The protective layer, in at least one first region arranged between the at least two adjacent elements, at least predominantly prevents a transmission of the electromagnetic radiation which can be generated by the optically active regions.

By means of the method steps mentioned above, an optoelectronic component comprising at least two adjacent elements is produced in which spurious luminescence of the adjacent elements is at least predominantly prevented.

In accordance with one advantageous configuration, arranging the at least two adjacent elements additionally comprises producing a first electrical contact between contact areas of the carrier element and the at least two adjacent elements. By virtue of jointly producing a first electrical contact together with arranging the at least two elements on the carrier element, the connection of the at least two adjacent elements is simplified.

In accordance with a further advantageous configuration, the method additionally comprises creating at least one cutout in the protective layer, applying an electrically conductive connection layer on the protective layer, and producing a second electrical contact between the connection layer and the at least two adjacent elements in the region of the at least one cutout. By virtue of applying a connection layer and producing a contact in the region of the cutout, it is possible for the electrical contact-connection of the at least two adjacent elements to be simplified further.

In accordance with a further advantageous configuration, applying the electrically insulating protective layer comprises areally applying a transparent insulation material to the carrier element with the at least two elements. Areally applying the transparent insulation material can be carried out particularly simply in terms of production engineering.

In accordance with one advantageous configuration, the electrically insulating protective layer is interrupted in the first region. Technically simple production of the optoelectronic component is made possible by virtue of the protective layer being interrupted in the region which serves for optical separation between the two elements.

In accordance with an alternative configuration, the transparent insulation material in the at least one first region is colored by introducing at least one first foreign substance, for example a dye or a radiation-absorbing or reflecting filler. Coloring an initially transparent insulation material in the region which serves for optical separation between the two elements likewise enables the optoelectronic component to be produced in a technically simple manner.

In accordance with a further advantageous configuration, the transparent material is spun onto a carrier material. A conventional spin-coating method can advantageously be employed for this purpose.

In accordance with a further advantageous configuration, the production method additionally comprises forming a conversion element in at least one third region of the protective layer by introducing at least one second foreign substance, for example an organic or inorganic phosphor, into the transparent insulation material. By introducing a second foreign substance, it is possible for a conversion element, for example a photoluminescent conversion layer, to be produced in a particularly simple manner.

In accordance with a further advantageous configuration, applying the electrically insulating protective layer comprises applying an insulation material that reflects or absorbs the electromagnetic radiation to the first side of the carrier element, wherein the insulation material has in each case at least one cutout in two third regions assigned to the at least two adjacent elements. As a result of applying an insulation material having at least two cutouts in the protective layer, a diaphragm structure is provided in a technically simple manner. In this case, the cutouts can be created before or after the application of the insulation material. The use of a colored foil, in particular, is suitable for this purpose.

In accordance with a further advantageous configuration, a depression is shaped between the at least two adjacent elements. The depression reduces the optical coupling of the adjacent elements.

In accordance with a further advantageous configuration, a reflecting element is arranged in the region of the depression. The reflecting element improves the optical decoupling of the adjacent elements.

In accordance with a further advantageous configuration, the reflecting element is deposited galvanically in the depression. In this way, the reflecting element can be produced particularly simply in terms of process engineering.

In accordance with a further configuration, the electrically insulating protective layer is advantageously applied to the first side by lamination.

BRIEF DESCRIPTION OF THE DRAWINGS

The invention is explained in greater detail below on the basis of exemplary embodiments. In the exemplary embodiments illustrated, identical reference symbols are used for elements having an identical or similar function.

In the figures:

FIGS. 1A and 1B show an optoelectronic component in accordance with one configuration of the invention, FIG. 2 shows an optoelectronic component in accordance with a further configuration of the invention, FIG. 3 shows an optoelectronic component in accordance with a further configuration of the invention, FIG. 5 shows a flowchart of a method for producing an optoelectronic component.

DETAILED DESCRIPTION OF ILLUSTRATIVE EMBODIMENTS

Figure 1A:
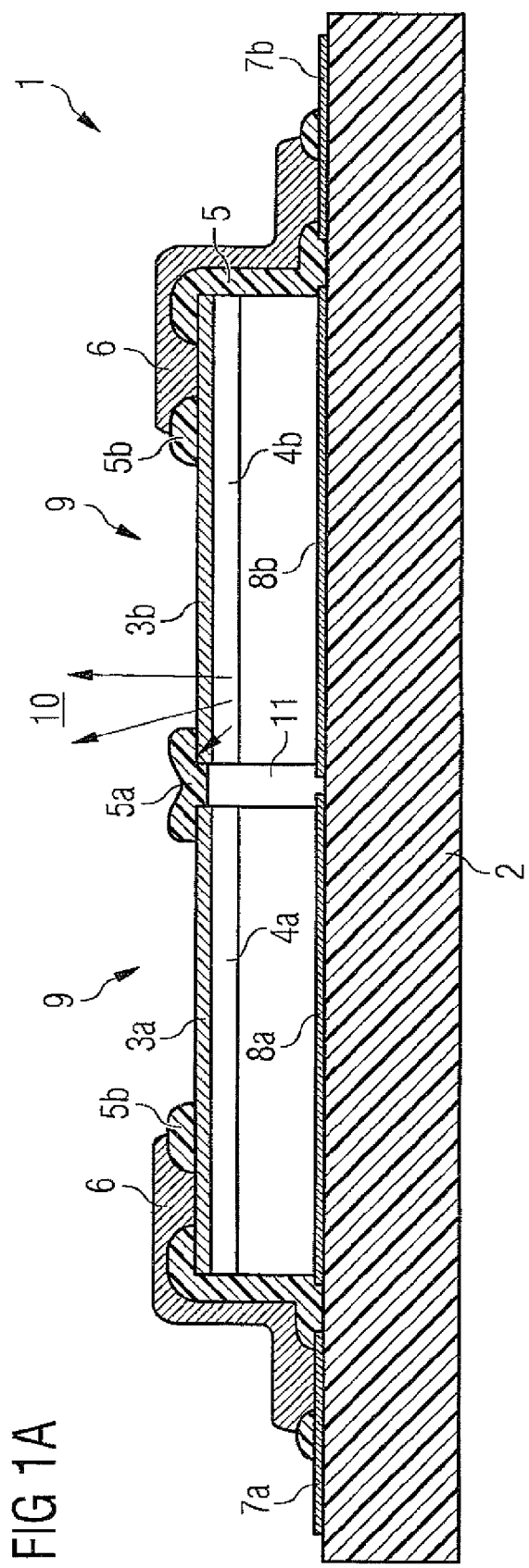

FIG. 1A shows a cross section through an optoelectronic component 1. The optoelectronic component 1 has a carrier element 2 and also two elements 3a and 3b arranged on the carrier element 2. Each of the elements 3a and 3b comprises an optically active region 4a and 4b, respectively.

By way of example, the carrier element 2 is a circuit board material on which are soldered two LED chips as adjacent radiation-emitting elements 3a and 3b. As an alternative, the carrier element 2 can also be embodied as a ceramic carrier on which the elements 3a and 3b are fixedly adhesively bonded. The use of a ceramic carrier instead of a circuit board material increases the thermal conductivity of the carrier element 1, in particular, and is therefore suitable for particularly powerful elements 3a and 3b. The use of a growth substrate, for example of a germanium wafer, as a carrier element is also possible.

The optically active region 4a and 4b, respectively, can be for example a region of a semiconductor layer stack in which majority and minority charge carriers of a semiconductor diode structure recombine with one another and emit electromagnetic radiation in the event of an operating voltage being applied.

In one exemplary configuration, the elements 3a and 3b are thin-film light-emitting diode chips, for example based on a nitride compound semiconductor material or semiconductor material systems such as, for example, InGaN or InGaAlP. In this configuration, a first and a second connection layer are arranged at least in places between the semiconductor layer sequence and the carrier element 2. A thin-film light-emitting diode chip is distinguished by at least one of the following characteristic features:

a reflective layer is applied or formed at a main area—facing the carrier element 2, in particular a carrier substrate—of the radiation-generating semiconductor layer sequence, which is, in particular, a radiation-generating epitaxial layer sequence, said reflective layer reflecting at least part of the electromagnetic radiation 10 generated in the semiconductor layer sequence back into the latter;

the carrier element 2 is not a growth substrate on which the semiconductor layer sequence was grown epitaxially, but rather a separate carrier element 2 which was subsequently fixed to the semiconductor layer sequence;

the semiconductor layer sequence has a thickness in the range of 20 µm or less, in particular in the range of 10 µm or less;

the semiconductor layer sequence is free of a growth substrate. In the present case, "free of a growth substrate" means that a growth substrate used, if appropriate, for growth purposes is removed from the semiconductor layer sequence or at least greatly thinned. In particular, it is thinned in such a way that it is not self-supporting by itself or together with the epitaxial layer sequence alone. In particular, the remaining residue of the greatly thinned growth substrate is unsuitable as such for the function of a growth substrate; and the semiconductor layer sequence contains at least one semiconductor layer having at least one area which has an intermixing structure which ideally leads to an approximately ergodic distribution of the light in the semiconductor layer sequence, that is to say that it has an as far as possible ergodically stochastic scattering behavior.

A basic principle of a thin-film light-emitting diode chip is described for example in the document I. Schnitzer et al., Appl. Phys. Lett. 63 (16) Oct. 18, 1993, pages 2174-2176, the disclosure content of which in this respect is hereby incorporated by reference. Examples of thin-film light-emitting diode chips are described in the documents EP 0905797 A2, U.S. Pat. No. 6,111,272, and WO 02/13281 A1, U.S. Pat. No. 7,109,527, the disclosure content of which in this respect is hereby likewise incorporated by reference.

A thin-film light-emitting diode chip is to a good approximation a Lambertian surface emitter and is therefore well suited, for example, to application in a headlight, for instance a motor vehicle headlight.

In the exemplary embodiment in accordance with FIG. 1A, the two adjacent elements 3a and 3b are at least partly covered with an electrically insulating protective layer 5. In the exemplary embodiment, the electrically insulating protective layer 5 consists of a first region 5a, which is arranged at least in part between the two adjacent elements 3a and 3b, and also two second regions 5b on those sides of the elements 3a and 3b which are remote from one another.

A connection layer 6 is arranged on the second regions 5b, which connection layer connects a surface of the elements 3a and 3b to connection contacts 7a and 7b on the carrier element 2. Furthermore, two contact areas 8a and 8b are arranged on the carrier element 2, via which contact areas the underside of the elements 3a and 3b can be supplied with an operating voltage.

The two elements 3a and 3b are separated from one another by a depression 11, wherein the first region 5a of the protective layer 5 partly projects into the depression 11.

FIG. 1B shows a plan view of the component 1, and the protective layer 5 can be discerned particularly well in this plan view.

In the exemplary embodiment, the protective layer 5 is formed by a polymer foil, from which two cutouts 9a are cut out or stamped out in a region above the elements 3a and 3b. In the switched-on state of the component, electromagnetic radiation 10, in particular visible light, e.g. having wavelengths in the range of between 400 and 800 nanometers, emerges through the cutouts 9a in the protective layer 5.

Furthermore, the protective layer 5 comprises further cutouts 9b and 9c, through which the connection layer 6 makes electrical contact with the underlying elements 3a and 3b and the connection contacts 7a and 7b, respectively. In the exemplary embodiment illustrated, the connection layer 6 comprises two separate conductor track elements, which were applied to the component 1 by means of known photolithographic methods, for example. It goes without saying that it is also possible to use a common connection layer for both elements 3a and 3b.

The polymer foil is preferably a colored or black foil which is wholly or at least predominantly opaque in the wavelength range of the electromagnetic radiation 10 emitted by the optically active regions 4a and 4b. Preferably, the protective layer 5, in the first region 5a, absorbs more than 50 percent of the electromagnetic radiation 10 impinging on it, particularly preferably more than 75 percent, for example 90 percent, preferably more than 95 percent, for example 98 percent or more. Electromagnetic radiation 10 which is emitted at an excessively large emission angle relative to the vertical with respect to the carrier element 2 is therefore predominantly absorbed by the polymer foil in the first region 5a and/or in the second regions 5b of the protective layer 5. This is illustrated, in particular, by the left-hand arrow on the basis of the element 3b on the right in FIG. 1A.

As becomes clear from FIGS. 1A and 1B, the protective layer 5 serves a double function. Firstly, it forms diaphragm elements for the electromagnetic radiation 10 emitted by the optically active regions 4a and 4b. Furthermore, it insulates the elements 3a and 3b from the connection layer 6 outside the desired contact regions. The optoelectronic component 1 in accordance with FIGS. 1A and 1B can be produced in a particularly simple manner and has an improved contrast ratio in comparison with conventional optoelectronic components comprising adjacent optically active regions 4a and 4b.

FIG. 2 shows an optoelectronic component 12 in accordance with a further configuration of the invention. The optoelectronic component 12 is constructed in a manner similar to the optoelectronic component 1 in accordance with FIG. 1. In particular, it likewise has a carrier element 2, on which are arranged two adjacent elements 3a and 3b each comprising an optically active region 4a and 4b.

In contrast to the optoelectronic component 1, a protective layer 5 is applied over the whole area onto the optoelectronic component 12 in accordance with FIG. 2. By way of example, the protective layer 5 consists of an initially clear polymer material that is spun onto the carrier element 2 in the region of the elements 3a and 3b.

The protective layer 5 of the optoelectronic component 12 has a first region 5a, two second regions 5b and also two third regions 5c. The first region 5a and also the two second regions 5b, which are arranged in the left-hand and right-hand part, respectively, of the elements 3a and 3b, are colored by the introduction of first foreign substances. In particular, as a result of the introduction of dye particles, they can be made wholly or at least predominantly opaque to light having a wavelength of the electromagnetic radiation 10 emitted by the optically active regions 4a and 4b.

By way of example, screen printing or diffusion methods are suitable for applying or introducing the foreign substances, wherein regions of the protective layer 5 that are not to be colored are covered by means of suitable masks. Instead of introducing foreign substances, it is also possible to employ photolithographic methods in which regions of the protective layer 5 are exposed by means of suitable masks and are changed in color by means of a subsequent development process.

In the exemplary embodiment illustrated in FIG. 2, the depression 11 between the first element 3a and the second element 3b is completely filled by the colored polymer material of the first region 5a of the protective layer 5. Consequently, spurious luminescence of the adjacent elements 3a and 3b is prevented to the greatest possible extent, preferably completely.

The third regions 5c of the protective layer 5 are arranged on the front-side surface of the elements 3a and 3b, through which the electromagnetic radiation of the optically active regions 4a and 4b is intended to emerge. In accordance with one configuration, the material of the protective layer 5 is consolidated in the third regions 5c, and in this case it retains its transparent property. The third regions 5c of the protective layer 5 therefore serve as a protective layer for the sensitive elements 3a and 3b and permit the electromagnetic radiation 10 to emerge substantially in an unimpeded fashion.

In accordance with one advantageous configuration, the third regions 5c furthermore serve as photoluminescent conversion elements 13. By way of example, a polymer layer can be converted into a conversion element 13 by the introduction of organic or inorganic phosphor. In this case, the conversion element 13 in accordance with FIG. 2 absorbs part of the electromagnetic radiation 10 having a first wavelength from the optically active regions 4a and 4b and emits electromagnetic radiation having a different wavelength.

By way of example, the optically active regions 4a and 4b can emit light having a comparatively short wavelength, for example blue light, which is converted by the conversion elements 13 at least partly into light having a longer wavelength, for example yellow or green and red light. Through the superimposition of electromagnetic radiation having a short wavelength and having a longer wavelength, the impression of a mixed-colored, for example white, luminous element arises for an observer of the optoelectronic component 12. In this way, the optoelectronic component 12 can be adapted to a predefined requirement profile.

Instead of the conversion elements 13 being produced by the introduction of phoshor as in FIG. 2, it is also possible, of course, to arrange separate conversion platelets on an optoelectronic component.

FIG. 3 shows a further configuration of an optoelectronic component 14. The optoelectronic component 14 comprises a carrier element 2, on which two elements 3a and 3b each having an optically active region 4a and 4b, respectively, are arranged in an adjacent fashion. The elements 3a and 3b are arranged on electrically conductive contact areas 8a and 8b, respectively, which connect the optically active region 4a and 4b, respectively, to a first electrical voltage potential. The adjacent elements 3a and 3b are arranged onto the carrier element 2 in such a way that a gap in the form of a depression 11 remains between them.

An electrically insulating protective layer 5 is arranged over the two elements 3a and 3b, which protective layer, in the exemplary embodiment, consists of respectively two lateral regions 5b and a cover region 5c at the surface of the optically active regions 4a and 4b. The electrically insulating protective layer 5 protects the elements 3a and 3b from mechanical and electrical disturbances. In particular, it insulates the element 3a and the element 3b from an electrically conductive connection layer 6, which connects the optically active regions 4a and 4b, respectively, to a second electrical voltage potential.

In the exemplary embodiment, the optoelectronic component 14 is a surface emitter, which, in the arrangement illustrated in FIG. 3, emits electromagnetic radiation 10, for example light in the visible range, upward, that is to say substantially perpendicularly away from the carrier element 2. The electrically insulating protective layer consists, for example, of a transparent polymer foil which transmits the electromagnetic radiation 10 predominantly in an unimpeded fashion.

In order to avoid spurious luminescence of the optically active regions 4a and 4b arranged in an adjacent fashion, the electrically insulating protective layer 5 was interrupted in an intermediate region 5a between the two elements 3a and 3b. An unintended optical waveguide function of the electrically insulating protective layer 5 from the first optically active region 4a to the second optically active region 4b, or vice versa, is thus avoided. By way of example, an interruption 15 can be produced by severing a polymer foil in the region of the depression 11. For this purpose, laser cutting methods are suitable, for example, in which ultrashort, high-energy laser pulses are used for locally eliminating the protective layer 5.

In order to suppress spurious luminescence even further, in accordance with the configuration illustrated, in the region of the interruption 15, additional galvanic mirror layers 16 are arranged on the insulating protective layer 5. The mirror layers 16 reflect electromagnetic radiation 10 emitted laterally by the first and second optically active regions 4a and 4b back in the direction of the source and thus prevent spurious luminescence.

The galvanic mirror layer 16 can be applied together with the electrically conductive connection layer 6, for example. In this case, the galvanic mirror layer 16 can be applied before or after interruption of the insulating protective layer 5. If the galvanic mirror layer 16 is applied beforehand, it should preferably be made so thin or flexible that, after interruption of the protective layer 5 has been effected, said mirror layer can be folded down together with said protective layer along the side areas of the elements 3a and 3b. The metals and metal alloys usually used in a galvanic production step generally have the flexibility required for this purpose. If appropriate, the protective layer 5 and/or the mirror layer 16 can be locally heated in the region of the bends in order to facilitate flexure.

Figure 4:
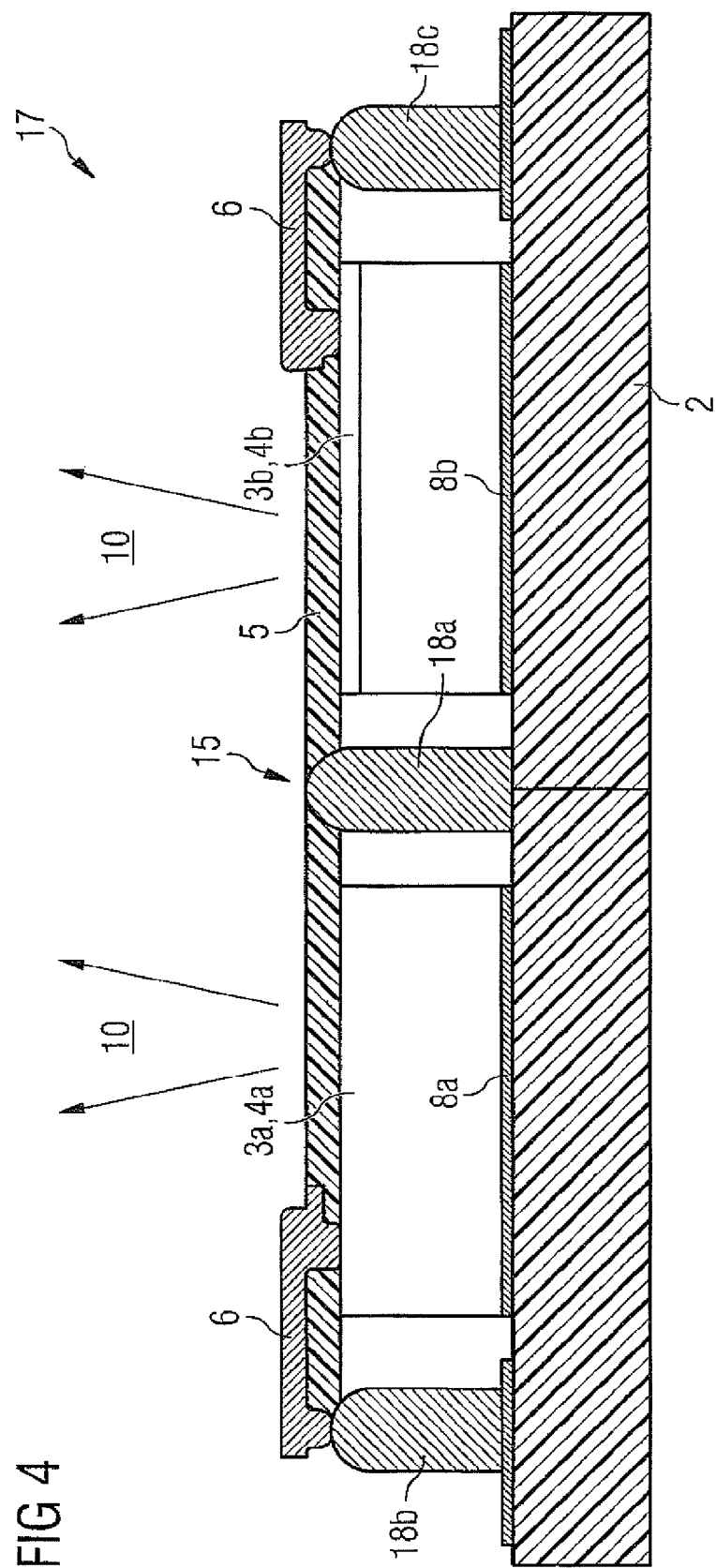
FIG. 4 shows an optoelectronic component in accordance with a further configuration of the invention.

FIG. 4 shows a further configuration of an optoelectronic component 17. The optoelectronic component 17 once again comprises a carrier element 2 with two elements 3a and 3b arranged thereon in an adjacent fashion and each having an optically active region 4a and 4b, respectively. The elements 3a and 3b arranged in an adjacent fashion are in each case arranged on an assigned contact area 8a and 8b, respectively, of the carrier element 2 and emit electromagnetic radiation 10 in a direction that is substantially perpendicular to the surface of the carrier element 2.

In order to prevent undesired spurious luminescence of the optically active regions 4a and 4b in the optoelectronic component 17, a first copper pillar 18a is arranged in an interspace between the elements 3a and 3b on the carrier element 2. The copper pillar 18a can be deposited on the carrier element 2 by means of a galvanic process, for example.

The arrangement in accordance with FIG. 4 furthermore contains two further copper pillars 18b and 18c, which serve for supplying the optically active regions 4a and 4b, respectively, with an operating current. For this purpose, an electrically conductive connection layer 6 is arranged on an electrically insulating protective layer 5 arranged over the elements 3a and 3b arranged in an adjacent fashion. It goes without saying that the first copper pillar 18a can also perform the function of one or both of the copper pillars 18b and 18c.

The electrically insulating protective layer 5 is interrupted by the first copper pillar 18a in the region thereof. This prevents waveguiding within the electrically insulating protective layer 5 and hence spurious luminescence of the optically active regions 4a and 4b. At the same time, the copper pillar 18a also acts as a reflecting element and thus prevents a direct optical coupling of the elements 3a and 3b arranged in an adjacent fashion. In order to improve the mechanical stability, the remaining cavity between the carrier element 2 and the protective layer 5 can be filled with a filling material.

In the exemplary embodiment illustrated in FIG. 4, the electrically insulating protective layer 5 can be applied to the optoelectronic component 17 by rolling lamination, for example. This results in simpler production by comparison with other production methods such as, for example, the so-called vacuum laminating technique. At the same time, the thickness of the electrically insulating protective layer 5 can be reduced, for example to a foil thickness of only approximately 20 µm. This has the advantage, inter alia, that the transmittance of the protective layer 5 is increased and the material costs of the latter are reduced.

FIG. 5 shows a flowchart of a method 30 for producing an optoelectronic component.

In a first step 31, a carrier element 2 is provided. By way of example, a circuit board with connection contacts 7a and 7b and contact areas 8a and 8b arranged on said printed circuit board can be provided. As an alternative, it is also possible to provide a ceramic or other carrier element which serves for mechanical fixing, for electrical connection and/or for cooling of elements 3a and 3b to be arranged thereon.

In a second step 32, at least two elements 3a and 3b each having an optically active region 4a and 4b are arranged on the carrier element 2. It is also possible for the elements 3a and 3b to be grown epitaxially directly on the carrier element 2.

In accordance with one configuration of the invention, the elements 3a and 3b are connected to one another at least in one layer. By way of example, a layer of a semiconductor layer stack having only a low conductivity in a horizontal direction can be used for mechanically connecting the adjacent elements 3a and 3b. As an alternative, the elements 3a and 3b are arranged separately from one another on the carrier element 2.

In one preferred configuration, the elements 3a and 3b are arranged on contact areas 8a and 8b, respectively, and, at the same time as the mechanical connection, are also electrically connected to the carrier element 2. By way of example, elements 3a and 3b can be electrically and mechanically connected by a solder material in the region of contact areas 8a and 8b, respectively.

In accordance with a further advantageous configuration, a plurality of elements 3 are arranged on the carrier element 2. By way of example, two rows arranged one above the other with a plurality of elements 3a and 3b can be arranged on a common carrier element, wherein all the elements of a first row serve for providing a low-beam light and all the elements 3b of the second row serve for providing a high-beam light.

In a step 33, a protective layer 5 is applied on the carrier element 2, in particular in the region of the elements 3a and 3b. In this case, the protective layer 5 can be adhesively bonded or laminated onto the elements 3a and 3b for example in the form of a polymer foil. As an alternative, it is also possible for a liquid material, for example a clear polymer material, to be spun onto the carrier element 2.

In accordance with one configuration, the protective layer 5 is opaque to electromagnetic radiation 10 from the optically active regions 4a and 4b at least in a first region 5a. In accordance with an alternative configuration, the applied protective layer 5 is initially transmissive, but is made at least partly opaque to electromagnetic radiation 10 in the first region 5a. By way of example, the introduction of foreign substances into the first region 5a is suitable for this purpose. As an alternative, the protective layer 5 can also be severed before or after application in the first region 5a.

If the protective layer 5 covers the entire surface of the elements 3a and 3b and is opaque to electromagnetic radiation 10 from the optically active regions 4a and 4b, one or a plurality of transmission windows, for example in the form of cutouts, have to be introduced into the protective layer 5. This is carried out as an optionally illustrated step 34 in FIG. 5. The production of cutouts 9, in the case of a light-opaque polymer foil, can be carried out as early as before the foil is applied to the elements 3a and 3b. In the case of a spun-on protective layer 5, parts of the protective layer 5 can be removed in third regions 5c or be made transparent to electromagnetic radiation 10 by means of suitable processing. Methods for structured shaping, pressing or casting of the protective layer 5, for example by means of a so-called Boschmann process, are also suitable for this purpose. Further cutouts in the protective layer 5 can be provided for making electrical contact with the elements 3 from the top side.

As an alternative to the introduction of foreign substances, a protective layer 5 composed of a photosensitive material, for example a silicone material, can be colored in the first, second and/or third region 5a, 5b and/or 5c. Photolithographic methods can be used for this purpose, which lead to either coloration or decolorization of selected regions of the protective layer 5 by means of exposure. As an alternative, it is also possible for individual regions of a photosensitive layer to be exposed and fixed and for unfixed layers to be removed in a later development step.

In an alternative method step 35, the electrically insulating protective layer is interrupted in the first region 5a. The interruption of the electrically insulating protective layer 5 can be effected for example by laser separating methods or else mechanical cutting methods, and severing can be carried out before or after the arrangement of the protective layer on the at least two elements 3 arranged in an adjacent fashion. Previous separation has the advantage that it is no longer necessary to carry out any further method steps after arranging the protective layer 5 on the elements 3 and the risk of contamination or damage of the optically active regions 4 is thus reduced. Subsequent severing of the protective layer 5 has the advantage that the interruption 15 can be carried out relative to the elements 3 arranged in an adjacent fashion at the desired location and in the same production process.

In a further alternative or additional method step 36, a reflecting element is at least partly arranged in an interspace between the elements 3 arranged in an adjacent fashion. By way of example, a metal layer can be deposited galvanically on the electrically insulating protective layer 5 before or after interruption of the protective layer 5. As an alternative, it is also possible to introduce a reflecting element in an interspace, for example by depositing a copper pillar 18a in a region of a depression 11 between the elements 3a and 3b.

In a further optional step 37, a connection layer 6 is applied to second regions 5b of the protective layer 5. Applying the connection layer 6 makes it possible to make contact with the elements 3a, 3b and hence the optically active regions 4a and 4b contained therein from the top side. Furthermore, the connection layer 6 acts as an additional diaphragm element of the optically active regions 4.

It is pointed out that the sequence of work steps illustrated in FIG. 5 is merely by way of example and can be adapted with regard to the order thereof. By way of example, it is possible for a protective layer 5 firstly to be applied to the elements 3a and 3b before the latter are arranged on the carrier element 2.

Furthermore, it is obvious to a person skilled in the art that all the features illustrated in FIGS. 1A and 1B and also FIGS. 2 to 4 can be combined with one another in virtually any desired manner.

The invention claimed is:

1. An optoelectronic component, comprising:
a carrier element;
a plurality of LED-chips arranged in an adjacent fashion on a first side of the carrier element, each of the LED-chips having one single optically active region for generating electromagnetic radiation; and
an electrically insulating protective layer arranged at least in part on a surface of the LED-chips that lies opposite the first side, wherein the protective layer, at least in a first region arranged between the LED-chips, at least predominantly prevents a transmission of the electromagnetic radiation generated by the one single optically active region and wherein the electrically insulating protective layer absorbs the electromagnetic radiation in the first region.

2. The optoelectronic component as claimed in claim 1, wherein the electrically insulating protective layer is interrupted in the first region.

3. The optoelectronic component as claimed in claim 1, wherein a depression is arranged between the LED-chips.

4. The optoelectronic component as claimed in claim 3, wherein the depression extends over an entire height of the LED-chips.

5. The optoelectronic component as claimed in claim 4, further comprising a reflecting element arranged in the first region, the reflecting element extending at least partly into the depression.

6. The optoelectronic component as claimed in claim 3, wherein the electrically insulating protective layer penetrates at least partly into the depression in a direction towards the carrier element.

7. The optoelectronic component as claimed in claim 1, wherein the LED-chips comprise a plurality of elements arranged in a matrix structure.

8. The optoelectronic component as claimed in claim 1, wherein at least parts of the protective layer are embodied as a colored foil.

9. The optoelectronic component as claimed in claim 8, wherein the colored foil comprises a black foil.

10. The optoelectronic component as claimed in claim 1, wherein the protective layer, in the first region, absorbs more than 90 percent of the electromagnetic radiation.

11. An optoelectronic component, comprising:
a carrier element;
a plurality of LED-chips arranged in an adjacent fashion on a first side of the carrier element, each of the LED-chips having one single optically active region for generating electromagnetic radiation;
an electrically insulating protective layer arranged at least in part on a surface of the LED-chips that lies opposite the first side, wherein the protective layer, at least in a first region arranged between the LED-chips, at least predominantly prevents a transmission of the electromagnetic radiation generated by the one single optically active region of each LED-chip; and
an electrically conductive connection layer for electrically connecting each of the optically active regions, the electrically conductive connection layer arranged on at least one second region of the protective layer.

12. The optoelectronic component as claimed in claim 11, wherein the protective layer, in the at least one second region, is at least predominantly opaque to the electromagnetic radiation generated by the optically active regions.

13. The optoelectronic component as claimed in claim 11, further comprising a photoluminescent conversion element arranged in at least one third region of the protective layer, the conversion element absorbing electromagnetic radiation having a first wavelength and emitting electromagnetic radiation having a second wavelength.

14. A method for producing an optoelectronic component, the method comprising:
- arranging a plurality of LED-chips adjacent to one another on a first side of a carrier element, each LED-chip having one single optically active region for generating an electromagnetic radiation, and
- applying an electrically insulating protective layer to a surface of the LED-chips that lies opposite the first side, wherein the protective layer, in at least one first region arranged between the LED-chips, at least predominantly prevents a transmission of the electromagnetic radiation generated by the optically active regions and wherein the electrically insulating protective layer absorbs the electromagnetic radiation in the first region.

15. The method as claimed in claim 14, further comprising:
creating at least one cutout in the protective layer,
applying an electrically conductive connection layer on the protective layer, and
producing an electrical contact between the connection layer and at least two adjacent elements in a region of the at least one cutout.

16. The method as claimed in claim 15, wherein a depression is formed between the LED-chips.

17. The method as claimed in claim 16, further comprising forming a reflecting element in the first region, the reflecting element extending at least partly into the depression.

18. The method as claimed in claim 14, wherein a depression is formed between the LED-chips.

19. The method as claimed in claim 14, further comprising forming a photoluminescent conversion element in at least a third region of the protective layer, the conversion element receiving electromagnetic radiation having a first wavelength and emitting electromagnetic radiation having a second wavelength.

20. The method as claimed in claim 14, wherein the protective layer, in the first region, absorbs more than 90 percent of the electromagnetic radiation.

* * * * *

UNITED STATES PATENT AND TRADEMARK OFFICE
CERTIFICATE OF CORRECTION

PATENT NO. : 8,513,682 B2  
APPLICATION NO. : 12/808953  
DATED : August 20, 2013  
INVENTOR(S) : Wegleiter et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 140 days.

Signed and Sealed this

Fifteenth Day of September, 2015

Michelle K. Lee
*Director of the United States Patent and Trademark Office*